United States Patent [19]

Kampwirth et al.

[11] 4,266,008

[45] May 5, 1981

[54] METHOD FOR ETCHING THIN FILMS OF NIOBIUM AND NIOBIUM-CONTAINING COMPOUNDS FOR PREPARING SUPERCONDUCTIVE CIRCUITS

[75] Inventors: Robert T. Kampwirth, Darien; Ivan K. Schuller; Charles M. Falco, both of Woodridge, all of Ill.

[73] Assignee: The United States of America as represented by the United States Department of Energy, Washington, D.C.

[21] Appl. No.: 96,859

[22] Filed: Nov. 23, 1979

[51] Int. Cl.$^3$ .............................................. H01L 39/02
[52] U.S. Cl. .................................. 430/318; 430/319; 427/63; 156/656; 156/659.1
[58] Field of Search .................. 427/63; 430/313, 314, 430/316, 318, 319; 156/656, 659.1, 662; 252/79.3; 29/599; 307/245, 277, 306

[56] References Cited

PUBLICATIONS

Brisbin et al., Low AC Loss Nb$_3$Sn Tape for Transmission Line Application, IEEE Trans. on Magnetics vol. Mag-15 No. 1, Jan. 1979.

*Primary Examiner*—Ralph S. Kendall
*Attorney, Agent, or Firm*—James W. Weinberger; Frank H. Jackson; James E. Denny

[57] ABSTRACT

An improved method of preparing thin film superconducting electrical circuits of niobium or niobium compounds in which a thin film of the niobium or niobium compound is applied to a nonconductive substrate, and covered with a layer of photosensitive material. The sensitive material is in turn covered with a circuit pattern exposed and developed to form a mask of the circuit in photoresistive material on the surface of the film. The unmasked excess niobium film is removed by contacting the substrate with an aqueous etching solution of nitric acid, sulfuric acid and hydrogen fluoride, which will rapidly etch the niobium compound without undercutting the photoresist. A modification of the etching solution will permit thin films to be lifted from the substrate without further etching.

5 Claims, No Drawings

METHOD FOR ETCHING THIN FILMS OF NIOBIUM AND NIOBIUM-CONTAINING COMPOUNDS FOR PREPARING SUPERCONDUCTIVE CIRCUITS

CONTRACTUAL ORIGIN OF THE INVENTION

The invention described herein was made in the course of, or under, a contract with the UNITED STATES DEPARTMENT OF ENERGY.

BACKGROUND OF THE INVENTION

This invention relates to a method for making thin film superconducting circuits of niobium and niobium-containing compounds. More specifically this invention relates to an improved method for etching thin films of niobium and niobium-containing compounds for preparing superconductive circuits. The invention also relates to an improved method for lifting off the circuits from the substrate.

As computers become more complex, there is a trend toward the development of superconducting circuits for use in the computers of the future. For example computer circuits, which are switches, generate heat as they open and close. The faster the switches operate, the more heat they develop. Some of the fastest switches produce so much heat that they must be placed relatively far apart in order that they will continue to work. To overcome the heat, high speed superconducting circuits using components such as the Josephson junction have been developed. These circuits may be prepared by applying a thin film of about 0.25 to 2.0 microns of superconductive material such as $Nb_3Sn$ or $Nb_3Ge$ to an appropriate smooth substrate(s) such as Pyrex, fused silica or $Al_2O_3$ (sapphire). The films may be applied to the substrate by any suitable means for depositing thin films such as sputter deposition, chemical vapor deposition, magnetron sputtering, or electron beam gum evaporation on a heated substrate. A layer of photoresist material is deposited on top of the film. A pattern of the desired circuit is then placed on the photoresist material which is then exposed and developed, resulting in a mask of the circuit pattern on the surface of the film. The circuit is then produced by contacting the film with an etchant solution which is supposed to dissolve only the unmasked film, leaving only the desired circuit as a thin film on the substrate surface.

However, niobium and superconducting niobium compounds are very inert so that it is a problem to etch the film at a rate which is fast enough to completely remove all of the excess film from the substrate without destroying the photoresist mask and consequently the circuit. It is also important not to etch the film at a rate which is too fast and hence difficult to control since it might undercut the photoresist mask, etch away too much of the film and destroy the circuit. Thus it is a difficult problem to find an etchant which can be controlled so that it will only remove the unmasked niobium and niobium compound film.

SUMMARY OF THE INVENTION

We have discovered an etchant which eliminates many of the hereinbefore described problems and with which we are able to prepare satisfactory thin film superconducting circuits of niobium and niobium compounds. Furthermore, we have found that by a slight modification of the solution, we are able to remove or lift off the film from the substrate.

According to the method of our invention, a thin layer of superconductive niobium or niobium compound is applied to a nonconductive substrate to form a superconductive film, a masking layer of photosensitive material is applied to the film and a circuit pattern placed over the photosensitive material which is then exposed and developed to form a circuit pattern of photoresist on the superconductive film. The film is then contacted with an aqueous etchant of 8.5 to 9.0 w/o $HNO_3$, 11.5 to 12.0 w/o $H_2SO_4$ and 12.25 to 12.75 w/o HF for a period of time sufficient to remove the unmasked film from the substrate, and removing the photoresist from the film, thereby forming a thin film superconducting circuit. If required, the thin film can be recovered or lifted from the surface of the substrate by contacting the film and substrate with an aqueous lift-off solution of 7.5 to 8 w/o $HNO_3$, 10.25 to 10.75 w/o $H_2SO_4$ and 16.5 to 17.0 w/o HF for a period of time sufficient for the thin film circuit to separate from the substrate.

The etchant formula has been found to provide an etching rate of from about 600 to 650 A°/sec in a niobium film and almost the same rate in the niobium compounds $Nb_3Sn$ and $Nb_3Ge$. Since the films for superconductive circuits are generally from about 5000 A° to 10,000 A° (0.5 to 1 micron) in thickness, this requires an etching time of about 8 to 20 seconds. This is generally sufficiently fast to preserve the photoresist material while providing clean circuit cuts with little or no undercutting. The lift-off solution, however, with little variation in formula from the etchant, had an etching rate of less than 7 A° per second.

The lift-off solution is also suitable for the recovery of the very thin sections of metal films required for coating specimens used in transmission electron microscopy (TEM).

It is therefore one object of the invention to provide a method for etching thin films of niobium and niobium compounds.

It is another object of the invention to provide a method for etching thin films of niobium and niobium compounds in order to prepare thin film superconducting circuits.

Finally it is the object of the invention to provide a method for lifting off thin films of niobium and niobium compounds from substrates.

DETAILED DESCRIPTION OF THE PREFERRED EMBODIMENT

These and other objects of the invention may be met by applying a thin layer of about 0.5 to 5.0 microns in thickness of superconducting niobium and niobium compounds selected from the group consisting of $Nb_3Sn$ and $Nb_3Ge$ onto a suitable nonconductive substrate to form a superconductive film, applying a positive photoresist layer to the surface of the film, placing an opaque pattern of a superconductive circuit of the photoresist, exposing and developing the photoresist whereby the circuit pattern remains on the surface of the film, contacting the film with an aqueous solution of 8.5 to 9 w/o $HNO_3$, 11.5 to 12.0 w/o $H_2SO_4$ and 12.25 to 12.75 w/o HF for a period of time sufficient to remove the unmasked film from the substrate and removing the surface of the film, thereby forming a thin film superconducting circuit of a niobium compound. The film may be lifted from the substrate by the additional step of contacting the circuit and substrate with an aqueous solution of 7.5 to 8.0 w/o $HNO_3$, 10.25 to 10.75 w/o $H_2SO_4$ and 16.5 to 17.0 w/o HF for a period of time sufficient to release the film from the substrate.

The thin film is preferably a superconducting compound of niobium such as $Nb_3Sn$ or $Nb_3Ge$ although it may also be of pure niobium. Generally the thin film is from 0.5 to about 1.5 microns in thickness although this is determined by the particular circuit which is to be prepared and the use to which the circuit is to be placed. The substrate may be of any of the typical substrate materials which match the thermal expansion of the superconductor and which are also resistant to the etching solution. For example, Pyrex and fused silica may be used with pure niobium while alumina is suitable for the niobium compounds. The film may be deposited on the substrate by any suitable method such as rf or dc sputtering on a heated substrate.

The photoresist may be any conventional photoresist which will form an etchant-resistant polymer layer on the surface of the film after it has been exposed to light and developed. Such materials include a type known as AZ 1350J available from the Shipley Company and MICRO 747 available from Eastman Kodak.

The etchant is an aqueous solution and may contain from about 8 to 10, preferably 8.5 to 9.0, w/o $HNO_3$, 11 to 13, preferably 11.5 to 12.0, w/o $H_2SO_4$ and 12 to 13, preferably 12.25 to 12.75, w/o HF. A solution of the preferred concentration at ambient room temperature was found to give an etching rate in niobium film of about 600 to 650 A° per second and at this rate did not undercut the film, lift the film from the substrate or destroy the photoresist mask. The etching rate can be increased if necessary by decreasing the amount of water present in the solution, thereby increasing the concentration of the other compounds.

Increasing the concentration of HF slightly in proportion to the nitric and sulfuric acids was found to decrease greatly the etching rate and provide an excellent lift-off solution. This solution contains 7 to 8.5, preferably 7.5 to 8, w/o $HNO_3$, 10 to 11, preferably 10.25 to 10.75, w/o $H_2SO_4$ and 16 to 17.25, preferably 16.5 to 17.0, w/o HF, the remainder water. A solution having a preferred concentration was found to have an etching rate of less than 7 A° per sec and generally provided lift-off of niobium films within 90 seconds, depending upon the substrate composition.

EXAMPLE I

Discs of Pyrex and fused silica were coated with a layer of 0.5 um of niobium by dc magnetron sputtering. The discs were spin coated at 5000 rpm for 25 sec with undiluted Shipley 1350J positive working photoresist. The resist thickness was estimated to be about 1.5 um. Following soft baking for 25 minutes at 90° C., the films were exposed to light through a mask circuit pattern. The resist was then spray developed for 90 sec with Shipley AZ 351 developing, rinsed with distilled water, dried and post-baked for 30 minutes at 130° C. in a forced air oven.

Etching was accomplished using an etchant consisting of 1 part 70% $HNO_3$, (8.75 w/o) 1 part concentrated $H_2SO_4$, (11.9 w/o) 2 parts 50% hydrofluoric acid (12.5 w/o) and 4 parts water. Etching was done at room temperature. It was found that it took about 10 sec to etch through 0.5 um of Nb. Patterns etched on Pyrex contained some defects including some breaks in the film believed due to lift-off due to poor film to substrate adhesion. This has been found to be a problem with Nb films deposited at less than 300° C. substrate temperatures on Pyrex.

EXAMPLE II

The same conditions prevailed as in Example I except that the substrate material was fused silica and the deposition temperature was about 500° C. The etchant produced film edges having great regularity with no evidence of lift-off and no evidence of film undercutting.

EXAMPLE III

A film of $Nb_3Sn$, 1.0 um in thickness was deposited on a substrate of alumina, heated to a temperature of about 800° C., by d.c. magnetron sputtering. A circuit was etched in the film under the same conditions described in Example I. After etching the circuit was observed to have regular, sharpe edges with no evidence of lift-off and no evidence of film undercutting.

The embodiments of the invention in which an exclusive property or privilege is claimed are defined as follows:

1. A method of preparing a thin film superconducting circuit of niobium or niobium compound comprising:
    applying a thin layer of a superconductive niobium or niobium compound to a non-conductive substrate to form a superconductive film;
    applying a masking layer of photo-sensitive material on the surface of the superconductive film;
    applying a circuit pattern to the masking layer surface of the photo-sensitive material;
    exposing and developing the photo-sensitive material to form a circuit pattern of photoresistive material on the surface of the superconductive film;
    contacting the film with an aqueous etchant of 8 to 10 w/o $HNO_3$, 11 to 13 w/o $H_2SO_4$ and 12 to 13 w/o HF for a period of time sufficient to remove the unmasked superconductive film from the substrate; and
    removing the photoresistive material from the surface of the superconductive film, thereby forming a thick film superconducting circuit on a non-conductive substrate.

2. The method of claim 1 including the additional steps of contacting the thin film superconducting film on the substrate with an aqueous lift-off solution of 7 to 8.5 w/o $HNO_3$, 10 to 11 w/o $H_2SO_4$ and about 16 to 17.25 w/o HF for a period of time sufficient for the film to lift off of the substrate.

3. The method of claim 2 wherein the etchant solution is about 8.5 to 9.0 w/o in $HNO_3$, 11.5 to 12.0 w/o in $H_2SO_4$ and 12.25 to 12.75 in HF.

4. The method of claim 2 wherein the lift-off solution is about 7.5 to 8.0 in $HNO_3$, about 10.25 to 10.75 in $H_2SO_4$ and about 16.5 to 17.0 w/o in HF.

5. In the method of preparing thin film superconducting circuits of niobium or niobium compounds wherein a thin layer of a superconductive niobium or niobium compound is applied to a nonconductive substrate to form a superconductive film, a layer of photoresist material is applied to the film, an electrical circuit pattern is applied to the photoresist which is exposed and developed to form a mask of the circuit in the photoresist on the superconductive film and the film is then etched to remove all of the film except that which is masked by the pattern, the improvement in etching the film comprising contacting the substrate, film and mask are contacted with an aqueous etchant solution of 8 to 10 w/o $HNO_3$, 11 to 13 w/o $H_2SO_4$ and 12 to 13 w/o HF for a period of time sufficient to remove the unmasked thin film from the substrate and stripping the mask from the surface of the film, thereby forming a thin film superconducting circuit.

* * * * *